(12) United States Patent
Iwasaki

(10) Patent No.: US 12,221,283 B2
(45) Date of Patent: Feb. 11, 2025

(54) COMPONENT SUPPLY UNIT STORAGE AND RETRIEVAL SYSTEM

(71) Applicant: FUJI CORPORATION, Chiryu (JP)

(72) Inventor: Masataka Iwasaki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 211 days.

(21) Appl. No.: 17/791,416

(22) PCT Filed: Jan. 14, 2020

(86) PCT No.: PCT/JP2020/000932
§ 371 (c)(1),
(2) Date: Jul. 7, 2022

(87) PCT Pub. No.: WO2021/144865
PCT Pub. Date: Jul. 22, 2021

(65) Prior Publication Data
US 2023/0064045 A1    Mar. 2, 2023

(51) Int. Cl.
*B65G 1/10* (2006.01)
*B65G 1/137* (2006.01)

(52) U.S. Cl.
CPC .................... *B65G 1/1376* (2013.01)

(58) Field of Classification Search
None
See application file for complete search history.

(56) References Cited

U.S. PATENT DOCUMENTS

| | | | |
|---|---|---|---|
| 3,058,545 A * | 10/1962 | Morehouse | B65G 1/1378 186/55 |
| 5,321,885 A | 6/1994 | Hino et al. | |
| 7,221,998 B2 * | 5/2007 | Brust | B07C 5/10 700/247 |
| 11,240,949 B2 * | 2/2022 | Kondo | H05K 13/086 |
| 11,312,584 B2 * | 4/2022 | Chirol | B65G 1/1378 |
| 2010/0172734 A1 * | 7/2010 | Cheng | B65G 47/918 414/800 |
| 2016/0280461 A1 * | 9/2016 | Geiger | B66F 9/18 |
| 2017/0027091 A1 | 1/2017 | Jakobsson et al. | |
| 2017/0267467 A1 * | 9/2017 | Kimoto | G05B 19/41865 |
| 2021/0371201 A1 * | 12/2021 | Chirol | G05B 19/4183 |

(Continued)

FOREIGN PATENT DOCUMENTS

JP    3-153098 A    7/1991
JP    6-6084 A     1/1994

(Continued)

OTHER PUBLICATIONS

International Search Report mailed on Mar. 24, 2020 PCT/JP2020/000932 filed on Jan. 14, 2020 (2 pages).

*Primary Examiner* — Joseph A Dillon, Jr.
(74) *Attorney, Agent, or Firm* — Oblon, McClelland, Maier & Neustadt, L.L.P.

(57) ABSTRACT

A component supply unit storage and retrieval system includes a unit storage configured to store multiple component supply units used when multiple components are supplied to a component mounter, a storage holding base configured to hold the unit storage, a unit warehouse configured to store the component supply units more than the unit storage, and a storage and retrieval robot configured to deliver the component supply unit between the unit storage and the unit warehouse.

7 Claims, 5 Drawing Sheets

(56) References Cited

U.S. PATENT DOCUMENTS

| | | | | |
|---|---|---|---|---|
| 2022/0132716 A1* | 4/2022 | Sanji | ................... | H05K 13/0882 |
| 2022/0134543 A1* | 5/2022 | Amend, Jr. | ............ | B25J 9/1602 |
| | | | | 700/245 |
| 2022/0256747 A1* | 8/2022 | Yoshino | ................... | H05K 13/02 |
| 2022/0411185 A1* | 12/2022 | Kawai | ................... | H05K 13/086 |
| 2023/0035634 A1* | 2/2023 | Iwasaki | ................ | H05K 13/086 |
| 2023/0037598 A1* | 2/2023 | Iwasaki | ................ | H05K 13/021 |
| 2023/0051556 A1* | 2/2023 | Nozawa | ............... | H05K 13/086 |
| 2023/0345688 A1* | 10/2023 | Nozawa | ............... | H05K 13/086 |
| 2024/0033932 A1* | 2/2024 | Steinbauer | ............. | B25J 9/1697 |
| 2024/0078862 A1* | 3/2024 | Boutin | .................... | G07F 9/002 |

FOREIGN PATENT DOCUMENTS

| | | |
|---|---|---|
| JP | 2674066 B2 | 11/1997 |
| JP | 5780779 B2 | 9/2015 |
| JP | 2018-190944 A | 11/2018 |
| WO | WO 2014/010083 A1 | 1/2014 |
| WO | WO 2015/019412 A1 | 2/2015 |
| WO | WO 2019/142336 A1 | 7/2019 |

* cited by examiner

COMPONENT SUPPLY UNIT STORAGE AND RETRIEVAL SYSTEM

TECHNICAL FIELD

The present specification relates to a storage and retrieval system corresponding to a set-up work involving retrieval of a component supply unit from a warehouse.

BACKGROUND ART

A technique of mass-producing board products by performing board work on a board on which printed wiring is performed has become widespread. Further, it is common to provide multiple types of board work machines for performing the board work side by side so as to configure a board work line. A component mounter among the board work machines uses a component supply unit loaded with the component container that contains multiple components. The loading operation for loading the component supply unit with the component container, in other words, a set-up operation for preparing the component supply unit for use, is often performed in a set-up area distant from the component mounter being operated (external set-up). The set-up component supply unit is conveyed to and installed in a component mounter (internal set-up).

The loading operation and the installing operation on the component mounter described above have been conventionally performed by human hand and require a lot of labor. Further, the loading operation is performed ahead of schedule to ensure that the production plan is achieved, which increases the number of work-in-process component supply units that cannot be diverted to other uses. Therefore, the management is complicated and further labor is required. In recent years, for the purpose of labor saving, a container loader that automates at least a part of the loading operation has been put into practical use. One example of a technique related to the automation of the loading operation and the installing operation disclosed in Patent Literature 1.

A second embodiment of Patent Literature 1 describes a configuration including a storage shed for storing a reel (one example of the component container), a storage shed for storing a feeder (one example of the component supply unit), a reel set device, a conveyance device, and a management section. The reel set device performs the set-up work for setting a reel to a feeder. The conveyance device conveys the set-up feeder to the component mounter. The management section controls the retrieval, the set-up work, the conveyance operation, or the like of the reels and the feeders, and manages the production of the component mounter. According to this configuration, it is said that the combination and the location of the reel and the feeder can be easily recognized so that the real and the feeder can be easily managed.

PATENT LITERATURE

Patent Literature 1: International Publication No. 2019/142336

BRIEF SUMMARY

Technical Problem

Incidentally, in the reel set device of Patent Literature 1, it is preferable that the loading operation is automated. However, since the loading operation is performed one by one in order, which is not necessarily efficient.

In the present specification, it is an object to be solved to provide a component supply unit storage and retrieval system that improves the efficiency of a set-up work involving retrieval of a component supply unit from a warehouse.

Solution to Problem

The present specification discloses a component supply unit storage and retrieval system including a unit storage configured to store multiple component supply units used when multiple components are supplied to a component mounter, a storage holding base configured to hold the unit storage, a unit warehouse configured to store the component supply units more than the unit storage, and a storage and retrieval robot configured to deliver the component supply unit between the unit storage and the unit warehouse.

Advantageous

In a component supply unit storage and retrieval system of the present specification, a storage and retrieval robot automatically performs an operation of retrieving multiple component supply units from a unit warehouse and storing the same in a unit storage. The multiple component supply units stored in the unit storage are collectively utilized in a subsequent set-up work or are collectively installed in a component mounter. Therefore, it is possible to improve the efficiency of the set-up work as compared with the conventional technique in which the component supply units are set-up one by one.

DESCRIPTION OF EMBODIMENTS

Figure 1:
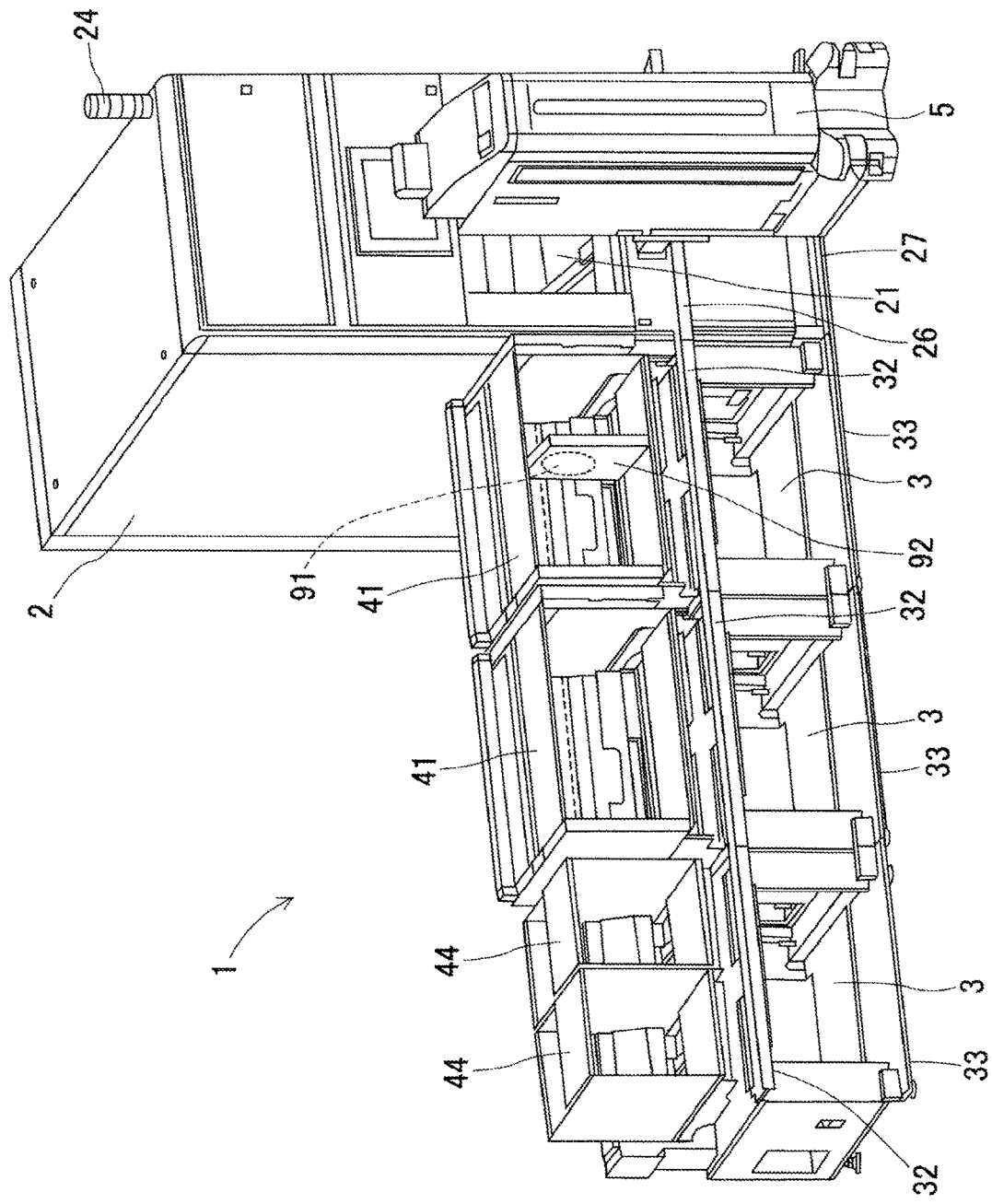
FIG. 1 is a perspective view schematically illustrating a configuration of a component supply unit storage and retrieval system of a first embodiment.

1. Configuration of Component Supply Unit Storage and Retrieval System 1 of First Embodiment A configuration of component supply unit storage and retrieval system 1 of a first embodiment will be described with reference to the configuration diagrams of FIGS. 1 and 2, and the functional block diagram of FIG. 3. Storage and retrieval system 1 corresponds to a loading operation for loading component supply unit 92 with component container 91 and related operations before and after the loading operation. Storage and retrieval system 1 is configured to include unit warehouse 2, storage holding base 3, unit storages (41, 44), and storage and retrieval robot 5.

Component container 91 is loaded in component supply unit 92 while containing multiple components. Component supply unit 92 is used when supplying the components contained in component container 91 in a mounting operation performed by component mounter 98. Identification codes indicating each type or individual are attached to component container 91 and component supply unit 92. The identification code of component container 91 includes information indicating the type of the component contained in component container 91. As the identification code, a barcode, a two-dimensional code, or the like is used. When component supply unit 92 is loaded with component container 91, the identification codes of both are read by the code reader. As a result, load information V (see FIG. 3) associating an individual of component container 91 with an individual of component supply unit 92, which is loaded with component container 91, is created.

As component container 91, a tape reel can be exemplified, and as component supply unit 92, an integral type feeder device in which the tape reel is directly loaded can be exemplified. A carrier tape in which multiple components are sealed at a predetermined pitch is wound and held on the tape reel. The feeder device is installed on component mounter 98 in a form to which the tape reel is loaded. The feeder device supplies the component to a component mounting tool of component mounter 98 by pulling out the carrier tape from the tape reel and sending the carrier tape to a component pick up position. When the mounting operation of the component proceeds and the component of the tape reel is consumed, the entire feeder device is exchanged.

The feeder device is not limited to an integral type and may be a separate type. The separate type feeder device is configured to include a feeder main body portion having a feeding mechanism of the carrier tape and a reel cassette to which the tape reel is loaded. The feeder main body portion is permanently provided in component mounter 98, and the separate reel cassette is disposed in the vicinity of the feeder main body portion. When the mounting operation of the component proceeds and the component of the tape reel is consumed, the reel cassette is exchanged. The reel cassette corresponds to component supply unit 92 to which component container 91 is loaded.

Hereinafter, a case where component supply unit 92 is an integral type feeder device and a tape reel serving as component container 91 is already loaded will be described. A tray may be used as component container 91, and a tray loading unit may be used as component supply unit 92.

Figure 2:
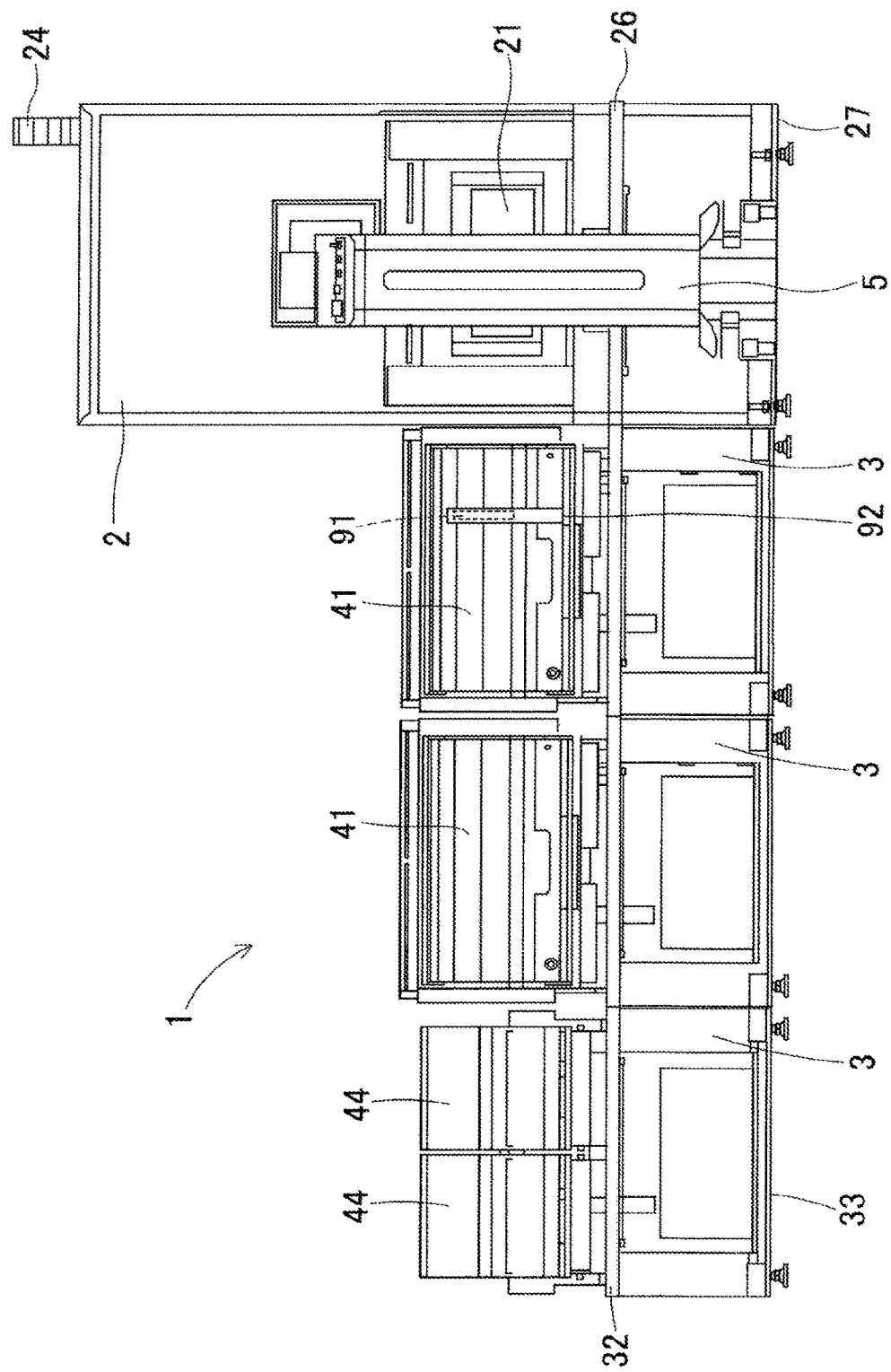
FIG. 2 is a front view schematically illustrating a configuration of the component supply unit storage and retrieval system of the first embodiment.

Unit warehouse 2 stores component supply units 92 more than component supply units 92 stored in unit storages 41 and 44 described later. As illustrated in FIGS. 1 and 2, unit warehouse 2 is formed in a large vertical rectangular parallelepiped shape. Unit warehouse 2 includes a storage and retrieval port 21 on a front face thereof. However, the configuration is not limited to this, a storage port and a retrieval port may be provided separately. Component supply unit 92, which is loaded with component container 91, is stored from storage and retrieval port 21 by an operator.

Upper section guide 26 extending in the left-right direction is provided on a lower portion of storage and retrieval port 21 on the front face of unit warehouse 2. Lower section guide 27 extending in the left-right direction is provided on a lowermost portion of the front face of unit warehouse 2. Upper section guide 26 and lower section guide 27 are formed in, for example, a protrusion shape protruding ahead or a groove shape opened upward.

Figure 3:
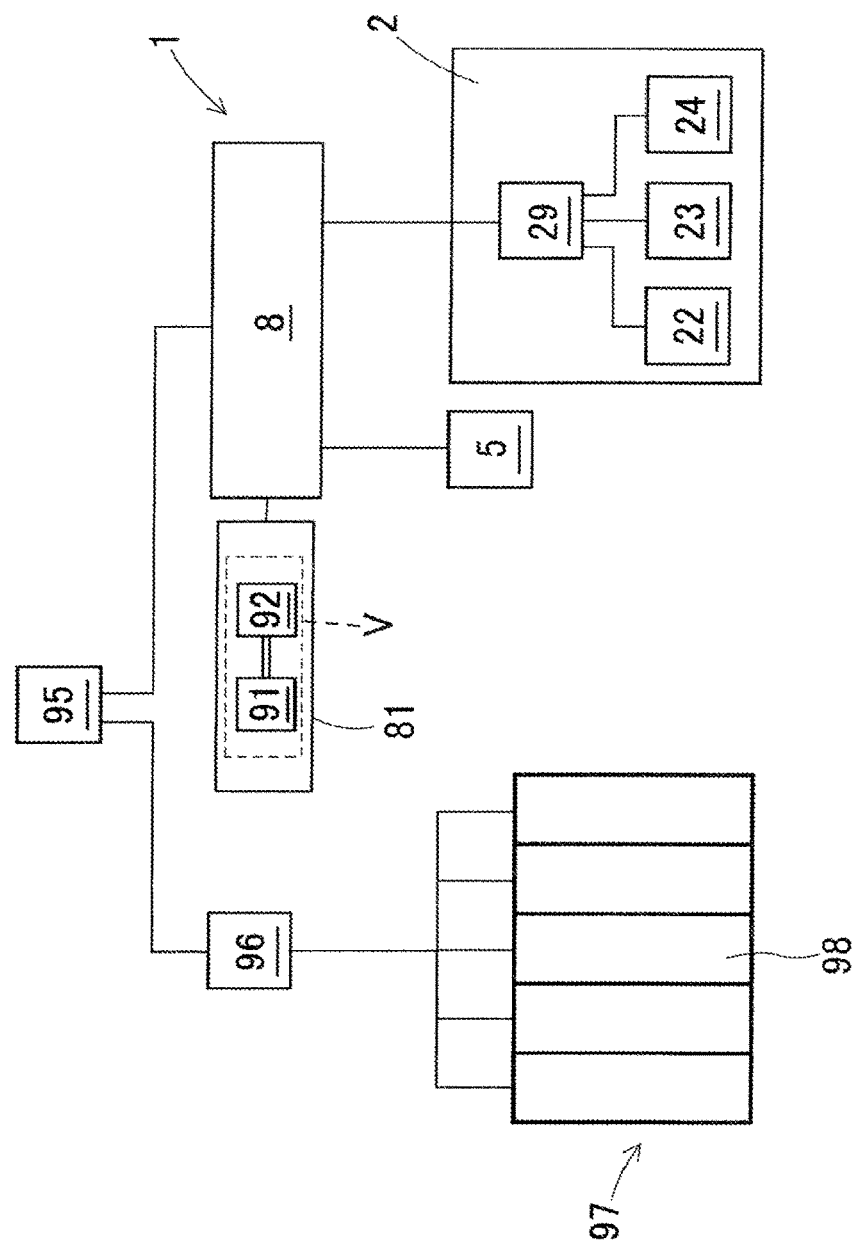
FIG. 3 is a functional block diagram illustrating a configuration of control in the first embodiment.

As illustrated in FIG. 3, multiple storing positions, actuator 22, and code reader 23 are provided in unit warehouse 2. The actuator 22 transfers component container 91 stored in storage and retrieval port 21 to a storing position, or transfers the component container 91 in the storing position to storage and retrieval port 21. Actuator 22 is controlled by warehouse control section 29.

Code reader 23 reads the identification code attached to stored component supply unit 92 and delivers the read result to warehouse control section 29. Therefore, warehouse control section 29 can recognize the individuals of all stored component supply units 92 in association with the storing positions. Further, warehouse control section 29 can recognize component container 91 loaded in each of the component supply units 92 with reference to load information V. Warning lamp 24 is provided on the right front side of the upper portion of unit warehouse 2. Warehouse control section 29 controls the lighting of warning lamp 24 when an abnormality occurs or a failure occurs and notifies an operator of the same.

As illustrated in FIGS. 1 and 2, storage holding base 3 is disposed on the left side of unit warehouse 2 adjacent to each other. However, the configuration is not limited to this, storage holding base 3 may be disposed on the right side of unit warehouse 2. Storage holding base 3 holds unit storages 41 and 44 on the upper side. Storage holding base 3 is formed in a rectangular parallelepiped frame shape. Upper section guide 32 extending in the left-right direction is provided on an upper portion of the front face of storage holding base 3. Lower section guide 33 extending in the left-right direction is provided on a lower portion of the front face of storage holding base 3. Upper section guide 32 and Lower section guide 33 are disposed at the same height as upper section guide 26 and lower section guide 27 of unit warehouse 2, and are formed in the same shape.

Storage holding base 3 is capable of being additionally installed. When storage holding base 3 is additionally installed, multiple storage holding bases 3 are disposed adjacent to each other in the left-right direction. Further, multiple storage holding bases 3 may be disposed so as to be dispersed on both the left and right sides of unit warehouse 2. As a result, multiple upper section guides 32 are connected in the left-right direction and are further connected to upper section guide 26 of unit warehouse 2 to form a long movement guide. Similarly, multiple lower section guides 33 are connected in the left-right direction and are further connected to lower section guide 27 of unit warehouse 2 to form a long movement guide.

Full width unit storages 41 are held on the right side and center on the upper side of storage holding bases 3 among three storage holding bases 3 illustrated in FIGS. 1 and 2. Further, two half width unit storages 44 are held on the upper side of storage holding base 3 on the left side. The width dimension of full width unit storage 41 is slightly smaller than the width dimension of component mounter 98. The width dimension of half width unit storage 44 is substantially half the width dimension of full width unit storage 41.

Unit storages (41, 44) stores multiple component supply units 92. Multiple storage slots set-up in the left-right direction are formed on the bottom face of the inner side of unit storages (41, 44). Storage slot is formed with, for example, a groove extending in the front-rear direction, into which component supply unit 92 is inserted from the front side and stored. In FIGS. 1 and 2, one component supply unit 92 is illustrated in full width unit storage 41 on the right side, and in actuality, multiple component supply units 92 are stored side by side in the left-right direction. The number of storage slots of half width unit storage 44 is half of the number of storage slots of full width unit storage 41.

Full width unit storage 41 is installed on component mounter 98 and serves as a main portion of a component supply device. Similarly, two half width unit storages 44 are installed on component mounter 98 to serve as a main portion of the component supply device. However, the configuration is not limited to this, unit storages (41, 44) may not be installed on component mounter 98 but may collectively perform a set-up work, transportation, or the like of stored multiple component supply units 92 to improve efficiency.

Storage and retrieval robot 5 delivers set-up component supply unit 92 loaded with component container 91 between unit storages (41, 44) and unit warehouse 2. Storage and retrieval robot 5 is formed so as to be longitudinally long. Storage and retrieval robot 5 includes a guide member and a movement drive section on the rear side. The guide member engages with the movement guide including multiple section guides (26, 27, 32, 33). As a result, the entire weight of storage and retrieval robot 5 is supported by the movement guide, and a movement direction is predefined. The movement drive section operates, for example, by using a non-contact power supply device or a battery (not illustrated) as a power source. The movement drive section is configured to include, for example, a combination of traveling wheels and a drive motor, or a movement mechanism to which a linear motor is applied. As a result, storage and retrieval robot 5 is moved on the front side of unit storages (41, 44) and unit warehouse 2 along the movement guide.

Storage and retrieval robot 5 further includes a unit holding space and a unit operating mechanism. The unit holding space is a space defined in the inner portion of storage and retrieval robot 5 and opened rearward. The unit holding space temporarily holds component supply unit 92 to be conveyed. The unit operating mechanism delivers component supply unit 92 between the unit holding space and unit storages (41, 44), and between the unit holding space and storage and retrieval port 21 of unit warehouse 2. At this time, since the height of storage and retrieval robot 5 is appropriately maintained by the engagement of the guide member and the movement guide, the delivering operation is stabilized. Storage and retrieval robot 5 is controlled by storage and retrieval control section 8.

2. Configuration Related to Control of Storage and Retrieval System 1

Next, a configuration related to control of storage and retrieval system 1 will be described. As illustrated in FIG. 3, storage and retrieval control section 8 is communicatively connected to streamlining processing section 95. Streamlining processing section 95 is communicatively connected to line control section 96. Further, line control section 96 is communicatively connected to each of multiple types of board work machines constituting board work line 97. Board work line 97 is a production line for mounting components on a board to mass-produce a board product. Component mounter 98 constituting board work line 97 is installed with set-up unit storages (41, 44) to enable the supply of the components.

Streamlining processing section 95 performs a streamlined process for improving the efficiency of the operation in board work line 97. As part of the streamlined process, streamlining processing section 95 optimizes the storage positions of multiple component supply units 92 in unit storages (41, 44) in order to improve the efficiency of the mounting operation of the components in component mounter 98. This streamlined process is also referred to as an optimization process, and various well-known techniques can be applied. Line control section 96 controls the operation of board work line 97 based on the result of the streamlined process received from streamlining processing section 95.

On the other hand, storage and retrieval control section 8 is communicatively connected to warehouse control section 29 of unit warehouse 2. Further, storage and retrieval control section 8 controls storage and retrieval robot 5. Further, load information memory section 81 attached to storage and retrieval control section 8 stores load information V. Storage and retrieval control section 8 includes a man-machine interface (an input section, a display section, a wireless communication section, or the like) for exchanging information with the operator.

Load information V or other various information are appropriately transmitted and received between each of the control elements described above. Therefore, storage and retrieval control section 8 can enable unit warehouse 2 and component mounter 98 to share load information V. Further, all of each control element described above needs not to be independent hardware. For example, storage and retrieval control section 8 and warehouse control section 29 may be achieved by different software in one computer device. Further, for example, storage and retrieval control section 8 may be achieved as a partial function of streamlining processing section 95. Further, the communication connection or the information transmission described above may be performed by using a wireless communication device. The control functions of storage and retrieval control section 8 and the like will be described in detail in the following description of operations.

3. Operation of Storage and Retrieval System 1

Figure 4:
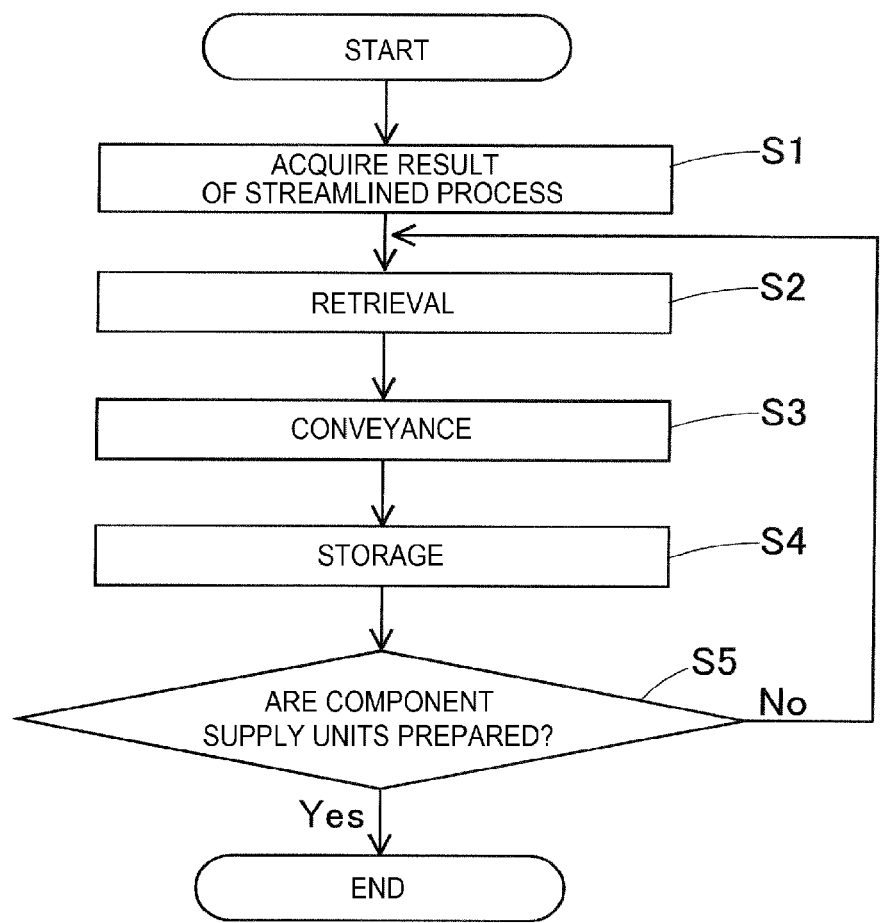
FIG. 4 is a diagram illustrating an operation flow for describing a control operation of a storage and retrieval control section in the first embodiment.

Next, the operation of storage and retrieval system 1 will be described with reference to FIG. 4. In step S1 in FIG. 4, storage and retrieval control section 8 acquires the result of the streamlined process from streamlining processing section 95. The result of the streamlined process includes an identification code of component supply unit 92 to be used and information about the storage position in unit storages (41, 44). The information about the storage position is represented by, for example, a slot number indicating a position of the storage slot.

In the next step S2, storage and retrieval control section 8 provides the identification code of component supply unit 92 to be used to warehouse control section 29 through the command. Warehouse control section 29 controls actuator 22 in accordance with the command and transfers component supply unit 92 to storage and retrieval port 21. In the next step S3, storage and retrieval control section 8 commands storage and retrieval robot 5 to convey component supply unit 92. Storage and retrieval robot 5 conveys component supply unit 92 at storage and retrieval port 21 to unit storages (41, 44) in accordance with the command.

In the next step S4, storage and retrieval control section 8 provides the storage positions in unit storages (41, 44) to storage and retrieval robot 5 through the command. Storage and retrieval robot 5 stores component supply unit 92 in the commanded storage position. In the next step S5, storage and retrieval control section 8 determines whether all component supply units 92 included in the result of the streamlined process are aligned in unit storages (41, 44). Thereafter, while all component supply units 92 are not aligned, storage and retrieval control section 8 repeatedly executes steps S2 to S5.

When all component supply units 92 are aligned by the repetition of the execution, the operation flow ends. At this point, unit storages (41, 44) are ready for use. The operator transports and installs one full width unit storage 41 or two half width unit storages 44 to component mounter 98. In one example of this installing operation, first, the operator connects a carriage (not illustrated) for transportation to the opposite side of storage and retrieval robot 5 at storage holding base 3. Secondly, the operator pulls out unit storages (41, 44) from storage holding base 3, transfers unit storages (41, 44) to the carriage, and transports unit storages (41, 44) to component mounter 98. Third, the operator connects the carriage to an installation position of component mounter 98. Finally, the operator transfers unit storages (41, 44) from the carriage to component mounter 98. As a result, component mounter 98 is ready to supply the components. At this time, load information V is shared by component mounter 98 by the communication or the like.

In component supply unit storage and retrieval system 1 of the first embodiment, storage and retrieval robot 5 automatically performs an operation of retrieving multiple component supply units 92 from unit warehouse 2 and storing the same in unit storages (41, 44). Thereafter, the multiple component supply units 92 stored in unit storages (41, 44) are collectively utilized in a subsequent set-up work or are collectively installed in component mounter 98. Therefore, it is possible to streamline the set-up work as compared with the conventional technique in which component supply units 92 are set-up one by one.

Further, storage and retrieval control section 8 controls for selecting multiple component supply units 92 which are retrieved from unit warehouse 2 and further controls the storage positions of retrieved multiple component supply units 92 in unit storages (41, 44), based on the result of the streamlined process. According to this configuration, subsequent to the streamlined process, it is possible to timely perform the set-up of unit storages (41, 44) to be installed in component mounter 98. Further, since the storage positions of multiple component supply units 92 in the unit storages (41, 44) are automatically controlled, there would be no possibility that the storage positions are erroneous. Further, since unit warehouse 2 for storing component supply unit 92 and storage holding base 3 for storing component supply unit 92 in unit storages (41, 44) are disposed adjacent to each other, a space-saving system configuration is achieved.

4. Component Supply Unit Storage and Retrieval System TA of Second Embodiment

Figure 5:
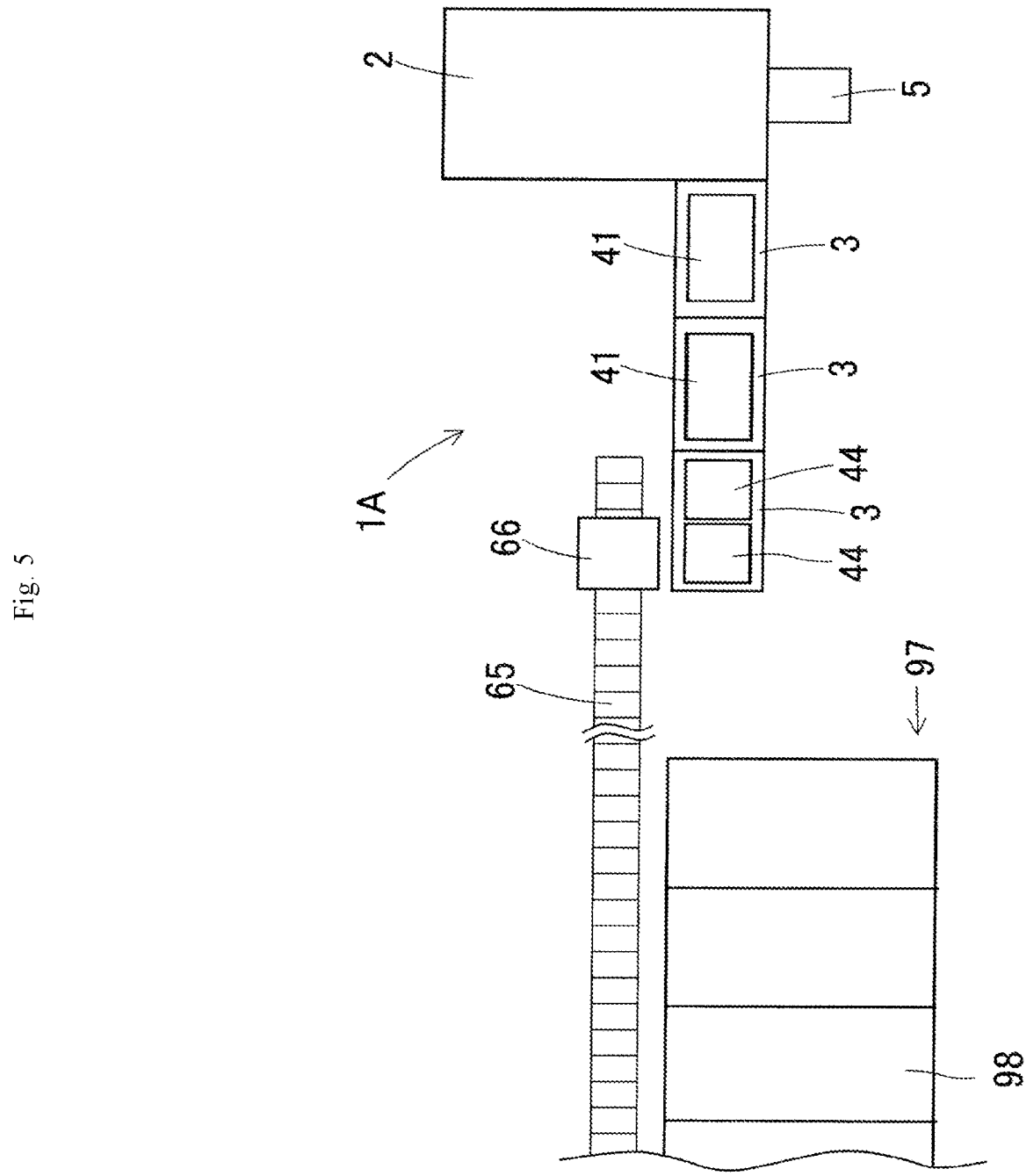
FIG. 5 is a plan view schematically illustrating a component supply unit storage and retrieval system of a second embodiment.

Next, with reference to FIG. 5, a description will be given of storage and retrieval system 1A of a second embodiment that differs from the first embodiment. As illustrated in FIG. 5, in the second embodiment, traveling path 65 and conveyance vehicle 66 are added to the configuration of the first embodiment.

Traveling path 65 is laid from the rear side of storage holding base 3 on the left side to board work line 97. Storage holding base 3 on the left side also serves as a carry-out station for carrying out component supply unit 92, which is loaded with component container 91, toward component mounter 98, and a carry-in station for carrying in component supply unit 92 that has been used in component mounter 98. Conveyance vehicle 66 travels on traveling path 65 in accordance with a wireless command from storage and retrieval control section 8 and also loads and unloads half width unit storage 44. Conveyance vehicle 66 appropriately reports a progress status of the conveyance operation to storage and retrieval control section 8. A standby position of conveyance vehicle 66 is set on the rear side of storage holding base 3 on the left side (illustrated in FIG. 5). Traveling path 65 may be laid over multiple board work lines 97 so that multiple conveyance vehicles 66 may travel while avoiding collisions. Further, conveyance vehicle 66 may be an AGV of a type in which physical traveling path 65 is unnecessary and travels by referring to information about the traveling path on map data.

In the above configuration, conveyance vehicle 66 removes half width unit storage 44 ready to be used from storage holding base 3 and loads the same. Next, conveyance vehicle 66 travels to component mounter 98, conveys half width unit storage 44, and installs the same in component mounter 98. Alternatively, conveyance vehicle 66 delivers half width unit storage 44 to the operator in the vicinity of component mounter 98. Further, conveyance vehicle 66 conveys second half width unit storage 44 in the same manner. According to the second embodiment, in addition to the storage of component supply unit 92 in half width unit storage 44, automation of the transporting operation of half width unit storage 44 is achieved.

5. Application and Modification of Embodiment

In the second embodiment, conveyance vehicle 66 may return half width unit storage 44 that has been used in component mounter 98 to storage holding base 3. Thereafter, component supply unit 92 is returned to unit warehouse 2 and stored. At this time, load information V is shared with unit warehouse 2 by the communication or the like. Further, conveyance vehicle 66 conveys half width unit storage 44 twice due to performance constraints. However, by increasing the size and improving the performance of conveyance vehicle 66, it is possible to convey full width unit storage 41. Further, the first and second embodiments are capable of various applications and modifications.

REFERENCE SIGNS LIST 1, 1A: component supply unit storage and retrieval system
2: unit warehouse
21: storage and retrieval port
22: actuator
23: code reader
26: upper section guide
27: lower section guide
29: warehouse control section
3: storage holding base
32: upper section guide
33: lower section guide
41: full width unit storage
44: half width unit storage
5: storage and retrieval robot
66: conveyance vehicle
8: storage and retrieval control section
81: load information memory section
91: component container
92: component supply unit
95: streamlining processing section
98: component mounter
V: load information

The invention claimed is:
1. A component supply unit storage and retrieval system comprising:
   a unit storage configured to store multiple component supply units used when multiple components are supplied to a component mounter;
   a storage holding base configured to hold the unit storage;

a unit warehouse configured to also store the component supply units with a storage quantity of the component supply units greater than a storage quantity of the unit storage;

a movement guide extending from a front face of the unit warehouse and a front face of the storage holding base;

a storage and retrieval robot configured to move along the movement guide and deliver the component supply units between the unit storage and the unit warehouse; and a load information memory section configured to store load information in which an individual of component containers and an individual of the component supply units, which are loaded with the component containers, are associated with each other.

2. The component supply unit storage and retrieval system according to claim 1, wherein the movement guide includes section guides provided on the front face of the storage holding base and the unit warehouse that are lined up in a movement direction of the storage and retrieval robot.

3. The component supply unit storage and retrieval system according to claim 2, wherein the storage holding base is capable of being additionally installed.

4. The component supply unit storage and retrieval system according to claim 1, wherein the unit storage is configured to be installed in the component mounter.

5. The component supply unit storage and retrieval system according to claim 4, further comprising:

a conveyance vehicle configured to convey the unit storage that stores the multiple component supply units to the component mounter.

6. The component supply unit storage and retrieval system according to claim 4, further comprising:

a storage and retrieval control section configured to control for selecting multiple component supply units which are retrieved from the unit warehouse and control storage positions of the retrieved multiple component supply units in the unit storage, based on a result of a streamlined process of optimizing the storage positions of the multiple component supply units in the unit storage, in order to streamline a mounting operation of the component in the component mounter.

7. The component supply unit storage and retrieval system according to claim 1, wherein the component supply unit is a feeder device loaded with a tape reel in which a carrier tape containing the multiple components is wound, or is a reel cassette loaded with the tape reel and formed separately from a feeder main body portion having a feeding mechanism of the carrier tape.

* * * * *